United States Patent [19]
Gregerson et al.

[11] Patent Number: 5,992,638
[45] Date of Patent: Nov. 30, 1999

[54] ADVANCED WAFER SHIPPER

[75] Inventors: Barry Gregerson, Deephaven, Minn.; Martin L. Forbes, Colorado Springs, Colo.

[73] Assignee: Empak, Inc., Colorado Springs, Colo.

[21] Appl. No.: 09/189,672

[22] Filed: Nov. 11, 1998

[51] Int. Cl.⁶ .................................................. B65D 85/30
[52] U.S. Cl. ......................... 206/711; 206/454; 206/509
[58] Field of Search ..................... 206/710, 711, 206/712, 454–456, 832, 508, 509; 220/786

[56] References Cited

U.S. PATENT DOCUMENTS

| | | |
|---|---|---|
| 4,555,024 | 11/1985 | Voss et al. .............................. 206/710 |
| 4,718,549 | 1/1988 | Rissotti et al. ........................... 206/711 |
| 4,793,488 | 12/1988 | Mortensen . | |
| 4,817,799 | 4/1989 | Gregerson et al. . | |
| 4,966,284 | 10/1990 | Gregerson et al. . | |
| 5,025,926 | 6/1991 | Gregerson et al. . | |
| 5,228,568 | 7/1993 | Ogino et al. ............................. 206/711 |
| 5,273,159 | 12/1993 | Gregerson . | |
| 5,758,794 | 6/1998 | Rider, Jr. et al. ........................ 220/786 |
| 5,775,508 | 7/1998 | Bongard et al. ......................... 206/454 |
| 5,873,468 | 2/1999 | Ejima et al. ............................. 206/711 |

*Primary Examiner*—Paul T. Sewell
*Assistant Examiner*—Luan K. Bui
*Attorney, Agent, or Firm*—Nikolai, Mersereau, & Dietz, P.A.

[57] ABSTRACT

A package for storing and shipping semiconductor wafers or memory disks is disclosed. The carrier includes a bottom, a cover and a cassette. An improved closure arrangement is provided that not only secures the cover to the bottom, but also compensates for pressure differentials between the inside and outside of the package and provides for improved drainage during washing operations.

11 Claims, 9 Drawing Sheets

ADVANCED WAFER SHIPPER

BACKGROUND OF THE INVENTION

I. Field of the Invention

The present invention relates to packaging. More particularly it relates to packaging for storing and transporting semiconductor wafers or memory disks.

II. Description of the Prior Art

A variety of packages have been developed and used for storing and transporting semiconductor wafers and memory disks. One such package is disclosed in U.S. Pat. No. 4,966,284 owned by Empak, Inc. of Chanhassen, Minn. This patent describes a three-part package. The package includes a bottom member, a top member and a separate wafer carrier designed to be enclosed within the top and bottom portions of the package. Packages of the type shown in U.S. Pat. No. 4,966,284 have been successfully used by a number of different semiconductor manufacturers.

A review of the '284 patent describes a number of different features associated with the package. All of these features are intended to hold and protect the fragile semiconductor wafers from damage. Such damage can arise not only from jilting and jarring of the wafers, but also from particulate contamination. The various cushions shown in the '284 are designed to safely and securely hold the wafers in place. Likewise, the various seals and the ability to tape the interface between the top and bottom covers serve to protect the wafers from contaminates.

The present invention builds on the success of the device shown in the '284 patent. Improvements relate to the ability of the container to protect the wafers, the ability of the container to be used with robotic equipment, and the ability to quickly and effectively clean the container.

SUMMARY OF THE INVENTION

The package of the present invention can be used to hold either semiconductor wafers or memory disks. As used herein, the terms "wafer" and "disk" are used interchangeably to avoid redundancy. Those reading this specification should understand that both of these terms are used inclusively to include both semiconductor and memory products.

The present invention, like the device shown in U.S. Pat. No. 4,966,284 has a bottom, a cover, and a wafer carrier designed to be enclosed by the top and bottom covers. Each of these components incorporate various improvements. First, the bottom is constructed from a polymer that is very stable, clean and low in moisture absorption. Second, the upper end of the bottom includes a U-shaped channel along its perimeter to increase the dimensional stability and rigidity of the box. The design of this U-shaped channel greatly eases the use of the device with robotic assembly equipment. Third, the bottom has been provided with rib receiving pockets to assist in providing a stable and secure seam interlock with the cover. Such rib receiving pockets may not be necessary on packages of smaller sizes. Fourth, the latch catches associated with the bottom have been positioned further from the center to reduce box deflection and any gap in the seam between the bottom and the top when the package is loaded with wafers. The bottom has also been equipped with drain slots in the latch area to eliminate liquid being trapped in the U-shaped channel. The design of these drain slots allows draining of this channel during washing operations and provides a method for the slot to be sealed with tape preventing particles from gaining access to the interior of the box. Next, the radial surface of the U-shaped channel which defines the top perimeter of the bottom allows for easy cover alignment during either automated or manual assembly. Finally, the features of the bottom are provided with a more rounded profile to again enable more efficient cleaning.

There are also a number of improvements associated with the cover of the present invention. Again, to the extent possible, the features of the cover are of a more rounded profile tc provide for easier cleaning. The latch catches of the cover have also been positioned further from the center to correspond with the latch catches of the base. Again, this serves to reduce the box deflection and seam gap when the box is loaded with wafers. On packages which incorporate rib receiving pockets on the base, ribs are provided on the side walls of the cover to provide a seam interlock with the pockets of the base. Again, on smaller sized packages neither these ribs nor the rib receiving pockets are required. In one embodiment, fingers are also molded into the top of the cover to cooperate with the wafer cassette to separate the wafers from each other and secure them from movement. In another embodiment, a separate wafer cushion has been provided. The wafer cushion is designed to allow it to be held to the cover by radial snaps molded into a cover. These radial snaps allows for easy assembly and disassembly of the wafer cushion and cover. Both wafer cushions also have a plurality of wafer fingers that have been designed using finite elemental analysis to generally reduce flexural creep of the plastic material. Further, the wafer cushion is constructed of the same material as the cassette and bottom. When the wafer fingers are part of a separate wafer cushion, they have an inclined design. Thus, when the wafer fingers are compressed, they nearly parallel the wafer edge. This serves to transfer the force load to the rear of the finger increasing its resistance to deflection and minimizing wafer movement.

The cover is essentially symmetrical for easy assembly. It is preferably made of a transparent polycarbonate to allow excellent visibility to the interior contents of the package. The corners of the cover include features which mate with features on the the base making a plurality of containers stackable. The cover includes a large flat surface to provide an area for adhesive labels. The cover also cooperates with the base to provide a tapeable area over the seam. By taping the seam, added protection against particulate contamination is provided.

In some situations, it may be desirable to have an elastomer seal between the bottom and cover. The cover and bottom are designed so the use of this seal is optional. One advantage of using the seal is to relieve pressure when exceeding approximately $\frac{1}{20}$ psi. The seal serves to prevent mechanical expansion and contraction of the assembly which could generate particles on the interior of the container. Another feature of the seal is that it includes a tab at four of its corners to provide ease in installation and removal of the seal.

The wafer carrier which serves as a part of the package of the present invention is of a generally standard design. One significant improvement has been made to the wafer carrier. Specifically, the wafer contact areas at the foot of the cassette are radiused in such a way that they match the shape of the wafers. This serves to eliminate the stress associated with supporting the wafers at a single point as the case in previous wafer carrier designs. By providing by a radial contact area, support is provided along a line thus serving to minimize the stress and reduce particle generation. This radial contact also provides a means to hold the wafer vertically with minimal tilt. By reducing the tilt, the problems associated with cross-slotting are eliminated because the wafers are being aligned in such a way that they engage the proper finger on the cover.

BRIEF DESCRIPTION OF THE DRAWINGS

The improvements achieved through the present invention will be more readily understood by reference to the following detailed description of the preferred embodiment when considered in conjunction with the accompanying drawings, in which like reference numerals designate like parts throughout the figures thereof and wherein.

DETAILED DESCRIPTION OF THE PREFERRED EMBODIMENTS

Figure 1:
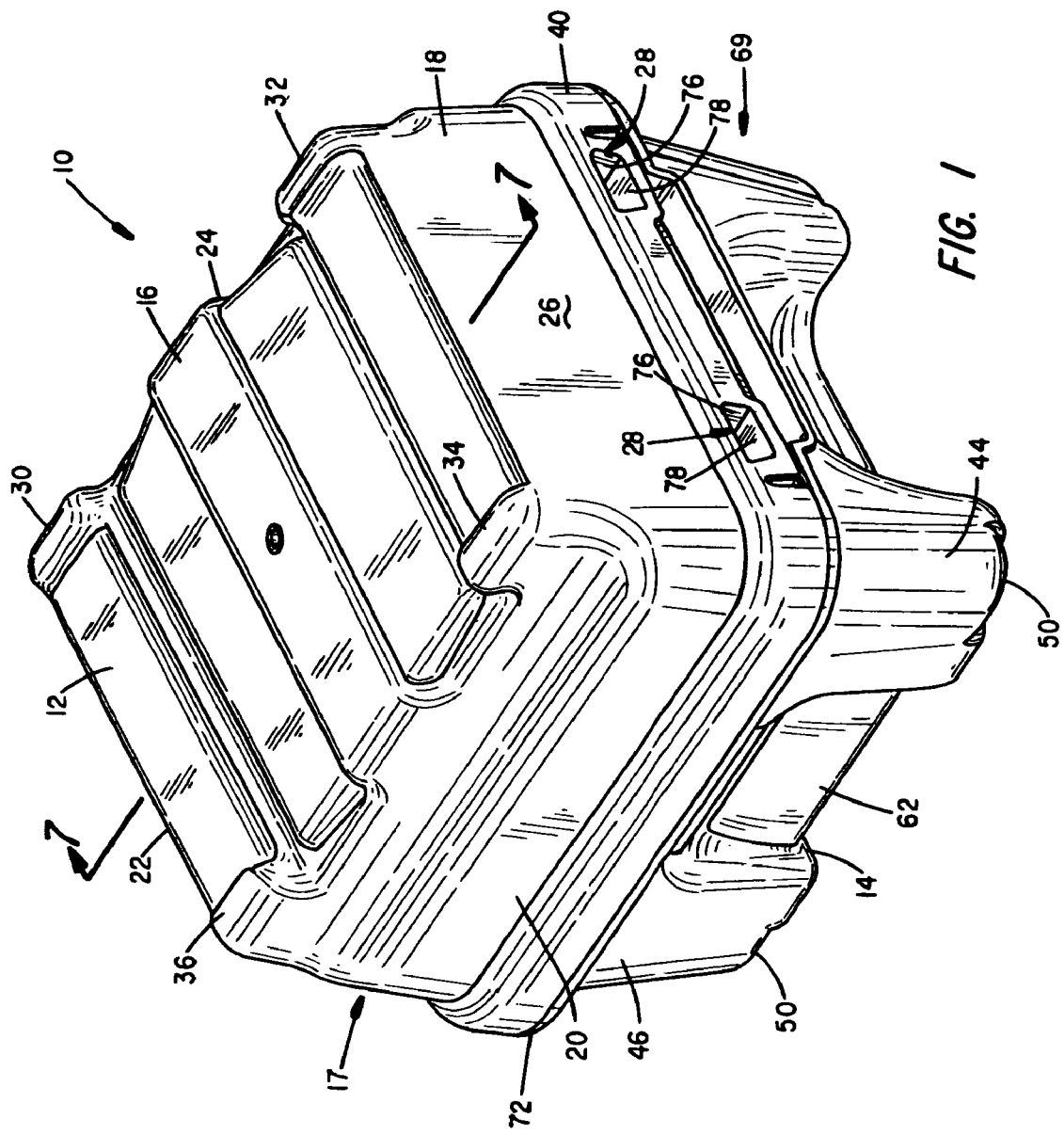
FIG. 1 is a perspective view showing the bottom and top of the container in the closed position.

FIG. 1 is a perspective view of the package 10 showing the cover 12 and the bottom 14. The cover 12 has a top 16 and a continuous wall 17 having four sides 18, 20, 22 and 24. The side 18 has a large flat area 26. The flat area 26 is ideally suited for applying adhesive labels to the cover of the container. Shown below the large flat area 26 are two latch assemblies generally designated as 28. These will be discussed in greater detail below. The cover 20 also includes four pads 30, 32, 34, and 36. As shown in FIG. 1, none of the walls 18-24 are perfectly flat. Instead all of them terminate in a lower rim 40 which projects outwardly and downwardly from the rest of the wall.

Figure 3:
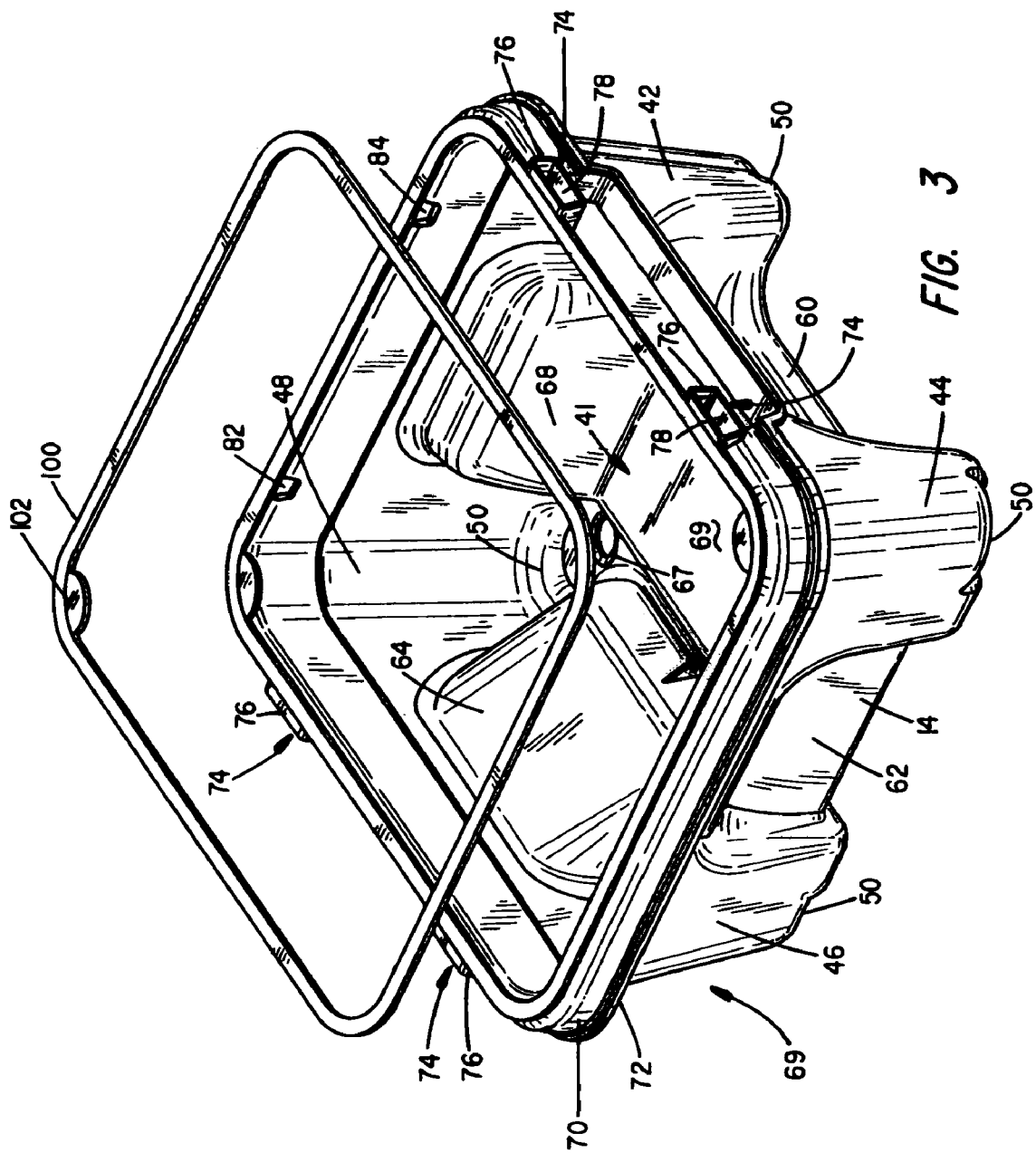
FIG. 3 is a perspective view of the bottom of the container and the removable seal.

As shown in FIGS. 1 and 3, the bottom 14 is not symmetrical. By making the bottom 14 non-symmetrical, one is able to mechanically identify the H-bar end of the cassette from the box 14 as shown in FIG. 3. The bottom 14 includes a base 41 and a continuous upright wall 69 that terminates in a continuous inverted U-shaped channel 70. The continuous upright wall 69 includes four corner posts 42, 44, 46 and 48 visible in the drawings. Each corner posts includes an indentation 50 which is capable of mating with members 32, 34 and 36 on the cover so that multiple packages incorporating the present invention can be readily stacked. The posts are separated by side walls 60, 62, 64 and 68. Again, to the extent possible the elements of the bottom 14 are rounded in profile to enable easier cleaning.

Figure 2:
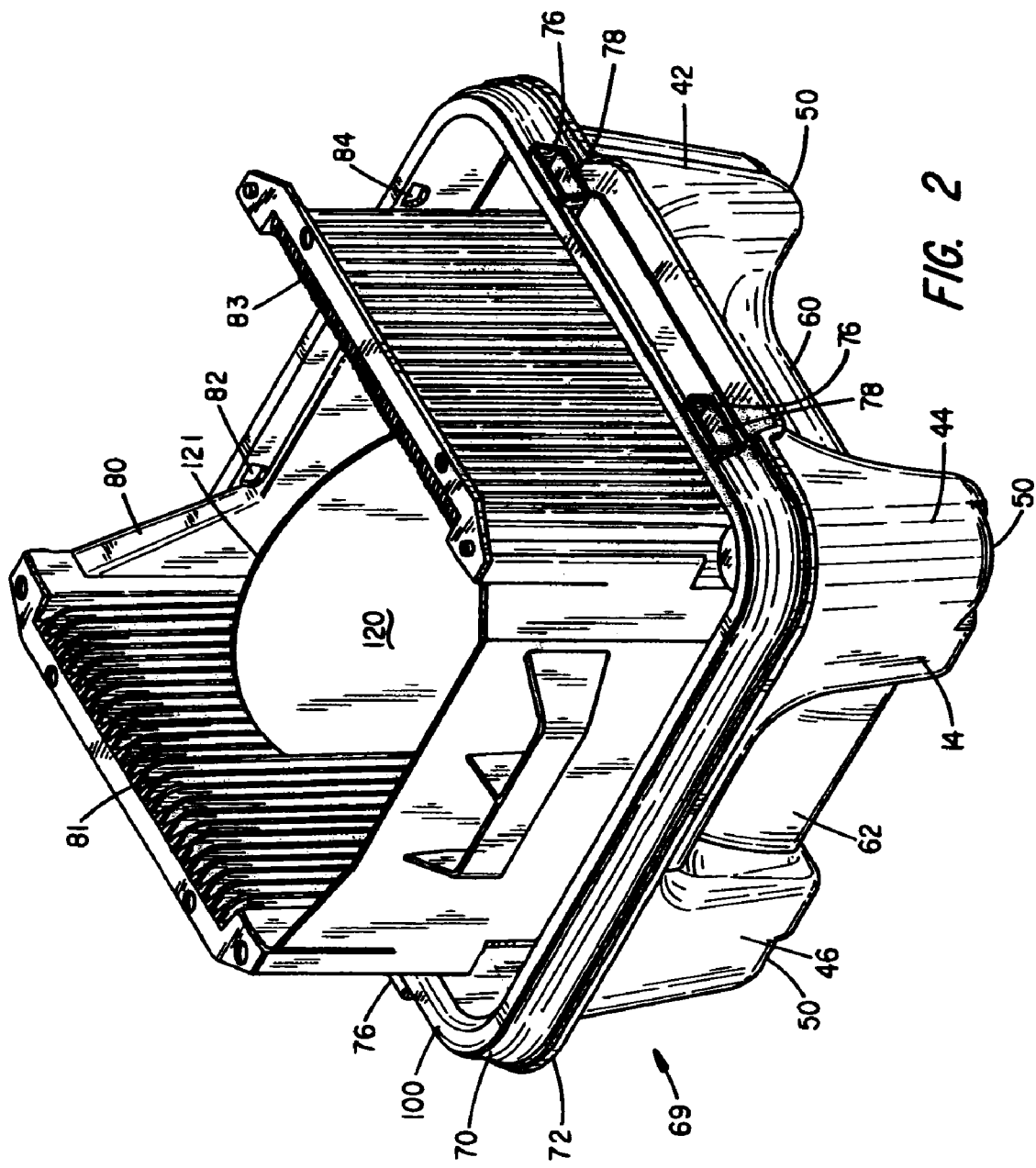
FIG. 2 is a perspective view showing the bottom of the container and the wafer cassette located within the bottom of the container.

One can also see how the side walls 60, 62, 64 and 68 and posts 42, 44, 46 and 48 are all integrally molded to form the continuous upright wall 69 and terminate in a continuous, inverted U-shaped channel 70 that rolls over and projects downwardly from the top of the continuous upright wall. Projecting outwardly from the bottom of the U-shaped channel 70 is a lip 72. As shown in FIGS. 1 and 2, each latch 28 comprises an outwardly projecting hollow member 74 having a trapezoidal shaped wall 76 and an open center 78. Each hollow member 74 projects from the U-shaped channel 70. The open center 78 is in communication with the space between the outer wall of the U-shaped channel and the remaining elements of the side wall of the base. Thus, during washing drainage of the U-shaped channel 70 is provided through the open center 78 of the member 74 of the latch 28. The base includes four such hollow members 74. Two are located along the wall 60, two are located along the opposite wall 64. The separation distance between the pair of latches along each wall 60 and 64 is significant. They are further apart than the latching assemblies of prior art latches. In fact, the center point of each hollow member 74 is closer to an end of the associated wall than to the center of the wall.

Details related to the interior design of the bottom 14 are shown in FIG. 3. As shown, the side walls 60 and 64 project an equal distance into the center cavity of the base. Also included is a channel 67 surrounding raised center section 69. This channel 67 and six ribs located with the channel allows for suitable mating between the bottom of wafer cassette 80 and the bottom 14. FIG. 3 also makes clear that the members 74 and the openings 78 therein do not extend all the way into the center cavity of the bottom 14. FIG. 3 also shows two of four rib receiving pockets 82 and 84 associate with wall 68 as well as the elastomeric seal 100 which includes a tab 102 Another pair of rib receiving orifices (not shown) are associated with wall 62.

Figure 4:
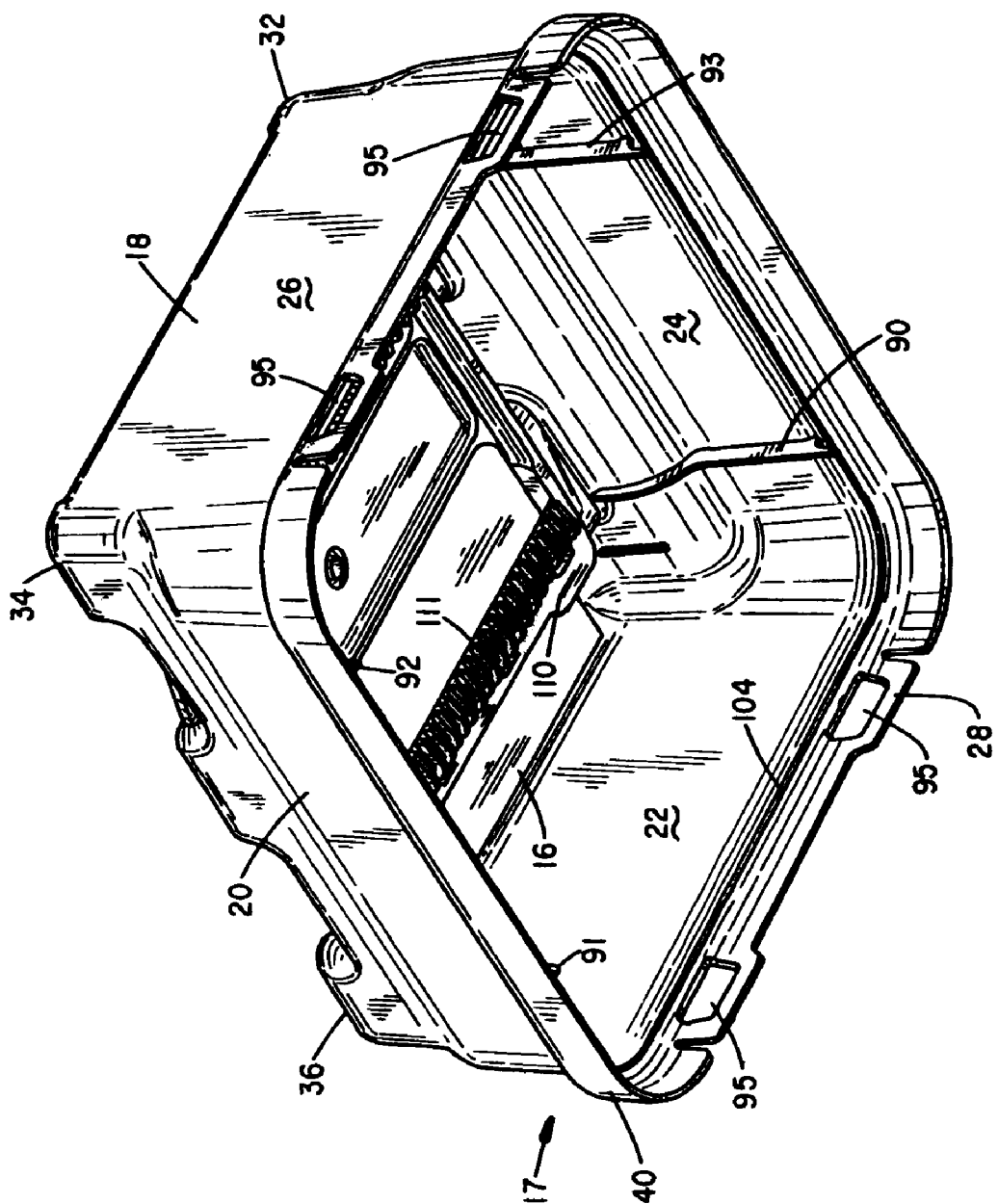
FIG. 4 is a perspective view showing the inside of the top of the container with a wafer cushion positioned therein.

FIG. 4 is shown as the interior of the cover 12. Projecting inwardly from the walls of the cover are four ribs 90, 91, 92 and 93. Each of these ribs has a somewhat pointed top section which is intended to mate with a corresponding rib receiving orifice 82 on the bottom 14. For example, rib 90 will mate with interlock orifice 82 and rib 93 will mate with interlock orifice 94 as the cover is closed. This provides additional strength along the sides 24 and 20 of the cover.

The sides 22 and 26 of cover 12 each include a pair of generally trapezoidal-shaped orifices 95. Each orifice 95 is intended to be aligned with one of the hollow members 74. The orifice 95 is slightly larger than the trapezoidal-shaped wall 76 so that these two elements of latch 28 can be mated to latch the cover 12 and bottom 14 together. More specifically, when the cover 12 and bottom 14 are in the closed position, the wall which defines each orifice 95 surrounds an associated member 74 to lock the cover to the bottom of the device. These orifices are intended to be aligned with the member 74 and spaced in such a way that when the package is assembled there is a reduction in box deflection and seam gap, particularly when the package is loaded with wafers.

FIG. 4 also shows a wafer cushion 110. In one embodiment, the wafer cushion 110 and cover 12 is integrally molded as a single unit. In another embodiment, a separate wafer cushion 110 is molded as a separate piece which is designed to snap into place within the cover 12 in the position shown in FIG. 4. When a separate wafer cushion 110 is provided, the wafer cushion 110 includes a plurality of fingers 111 which are intended to engage the wafers. The fingers 111 are shaped in such a way that when they are compressed, they nearly parallel the wafer edge. This serves to transfer the force to the rear of the spring 114 decreasing its resistance to deflection and minimizing wafer movement.

This can be better seen in FIG. 6 which will discussed in greater detail below.

Figure 5:
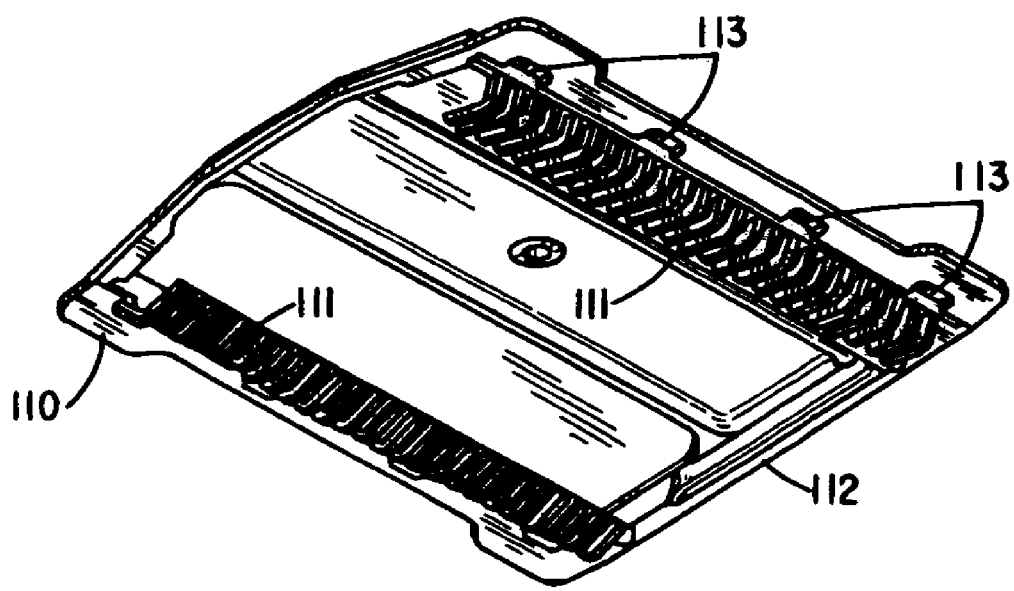
FIG. 5 is a perspective view of a removable wafer cushion.

FIG. 5 shows a separate wafer cushion 110. The wafer cushion has a plurality of fingers 111, an exterior frame 112 and a plurality of orifices 113 through the exterior frame 112. The frame 112 and orifices 113 are used to secure the wafer cushion 110 to the container cover 12.

Figure 6:
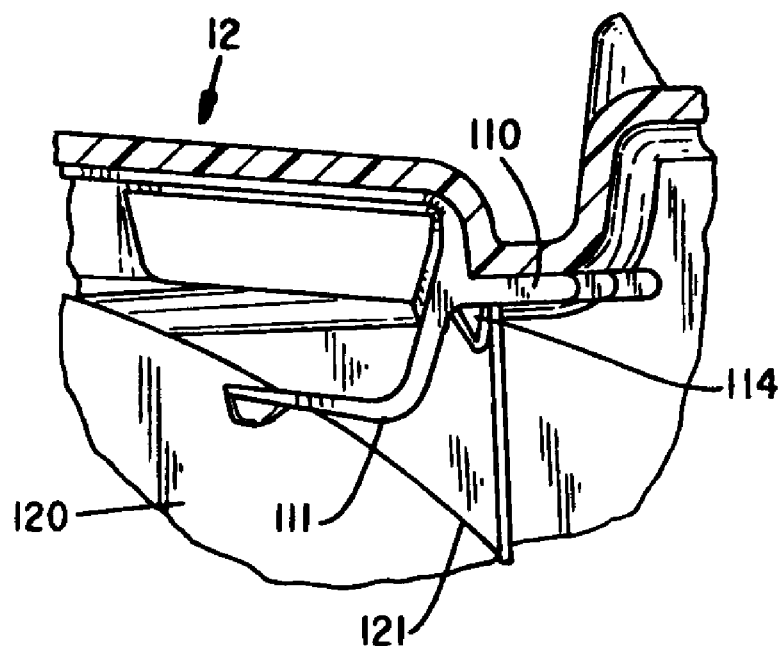
FIG. 6 is a cross-sectional view showing the manner in which the wafer cushion can be secured to the top of the cover.

FIG. 6 shows in greater detail the relationship between a wafer 120, the cover 12, and components of the wafer cushion 110, including the fingers 111, the frame 112 and the orifices 113. As shown, the cover 12 includes radial snaps 114. These snaps 114 are designed to pass through the orifices 113 and engage the frame 112 to hold the cushion 110 in place. The fingers 111 project downwardly and inwardly from the outside of the frame 112. As indicated above, when the fingers 111 engage a wafer 120, they are compressed in such a way that the fingers become inclined to the point where they are nearly parallel the wafer edge 121. Again, this serves to transfer the force load to the rear of each spring finger increasing its resistance to deflection and minimizing wafer movement.

Figure 7:
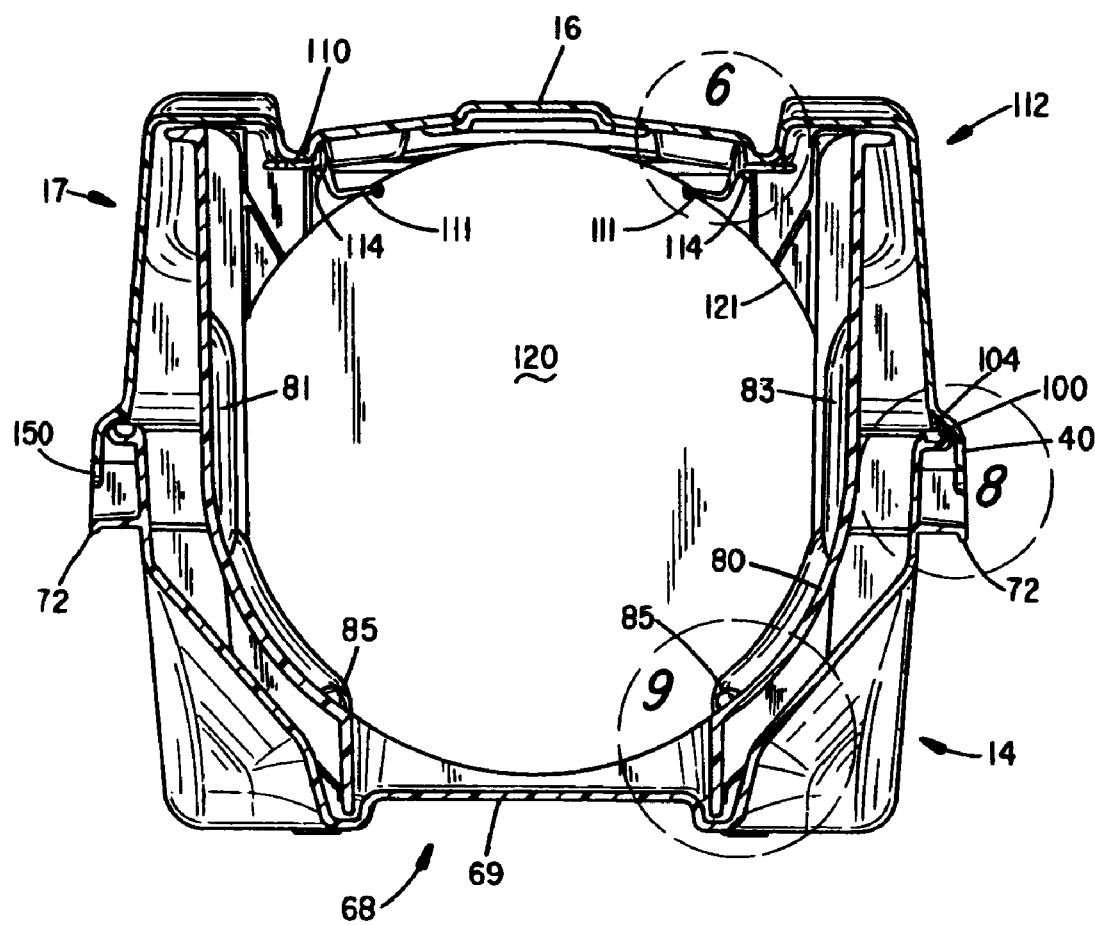
FIG. 7 is a cross-sectional view showing the assembly of the bottom, cover, wafer cassette and cushion.

FIG. 7 is a cross-sectional view showing the manner in which the components of the package 10 cooperate to hold wafers, (such as 120) in place. As shown, the bottom 14 and cover 12 enclose the cassette 80 and any wafers 120 held therein. The cassette 80 has two rows of teeth 81 and 82. The teeth in rows 81 and 82 are separated by slots. The wafers are held in the slots and kept separate by the teeth. Thus, the teeth in rows 81 and 82 cooperate with the teeth 111 associated with the cover to securely retain the wafers.

Figure 9:
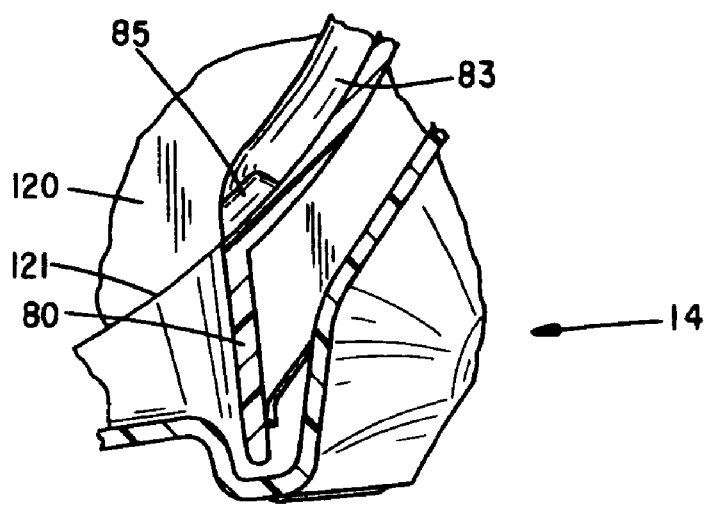
FIG. 9 is a more detailed view showing the radial contact area between the wafer and wafer cassette.

Generally speaking, in the prior art contact between the teeth and the wafers has been restricted to a very few points. This has been a goal of prior art designs based upon the theory that it would reduce rubbing and scraping of the wafers which not only damages the wafers, but also results in increased particulation. One disadvantage of this prior art technique is that high stress points were created circumventing the theoretical advantages of the prior art approach. One improvement made in the wafer carrier 80 of the present design is to provide a radial contact area 85 in the foot area of the teeth in rows 81 and 82. See FIGS. 7 and 9. This eliminates the high stress point contact used in previous designs. Instead, contact along a line is provided to minimize stress on the wafers and reduce particle generation. It also serves to hold the wafer 120 vertically in the cassette 80 with minimal tilt. Therefore, the chance of the wafers becoming cross-slotted with the springs 111 associated with the cover 12 is greatly reduced.

Figure 8:
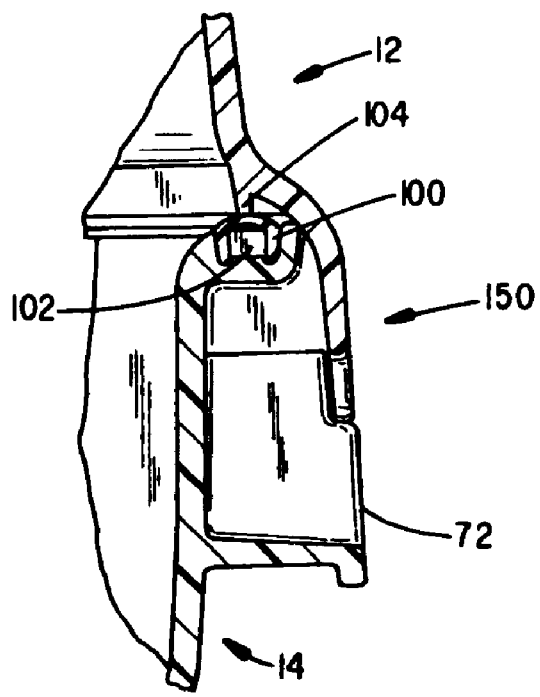
FIG. 8 is a more detailed cross-sectional view showing the interface between the bottom, the top and the seal.

FIGS. 7 and 8 show in cross-section the manner in which the seal 100 cooperates with the bottom 14 and cover 12. The elastomer seal 100 seats within a channel 102 in the bottom 14. The top includes a downwardly projecting lip 104 which engages the seal 100 when the package is closed. The seal 100 is designed to relieve pressure when the differential between the inside and the outside of the package exceeds approximately 1/20 pounds per square inch. This serves to prevent mechanical expansion and contraction of the package during shipping which could cause particle generation or other damage to the wafers 120.

FIGS. 7 and 8 also show that when the package is closed, a large relatively flat surface 150 is created along the seam between the cover 12 and bottom 14 of the package. This is a surface for taping the seam with an adhesive-backed tape to prevent contaminates from entering the package.

Figure 10:
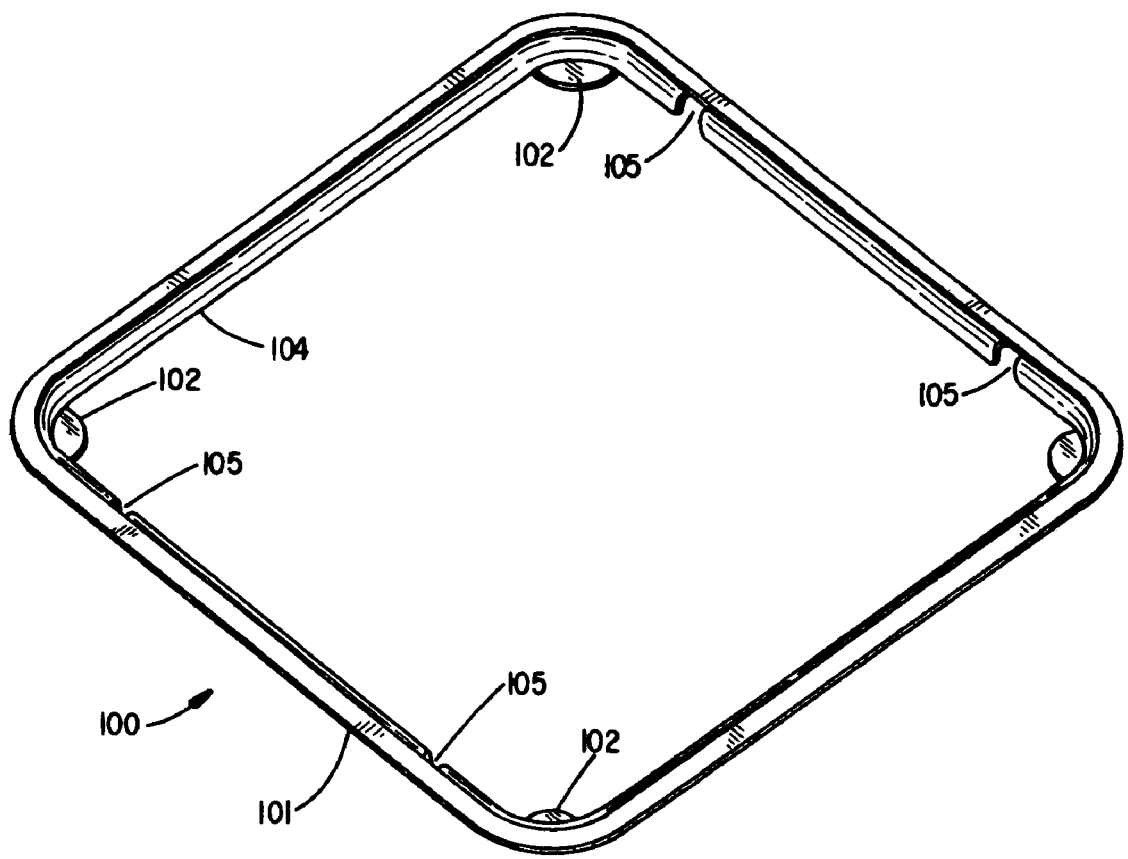
FIG. 10 is a first perspective view of an alternative seal.
Figure 11:
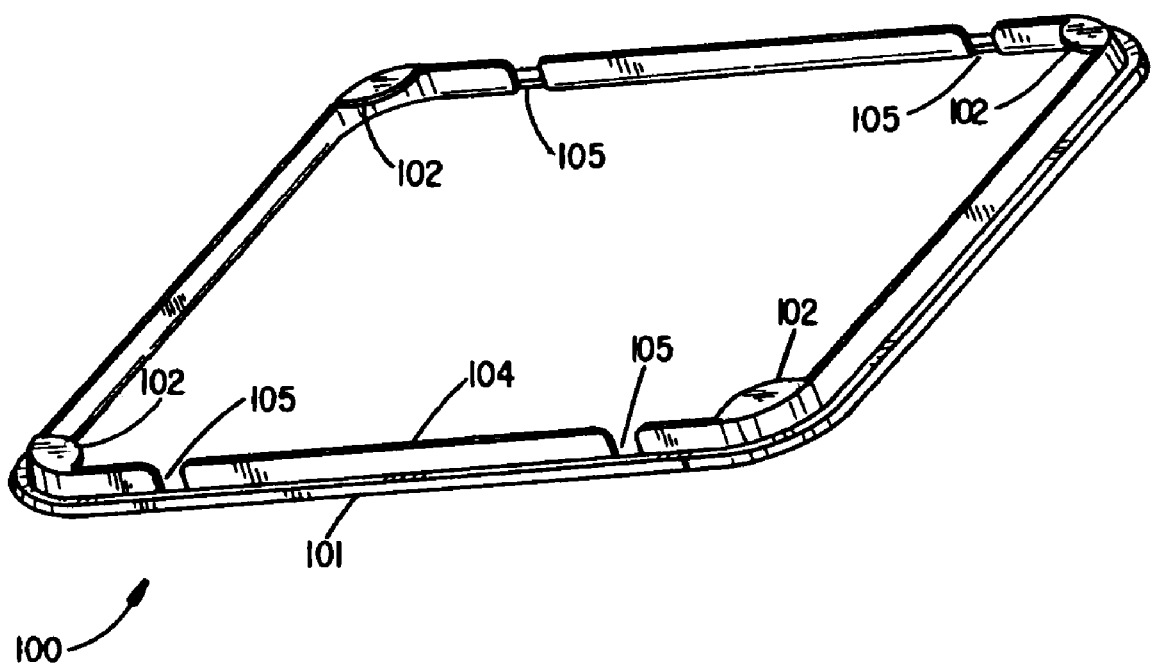
FIG. 11 is a second perspective view of the alternative seal shown in FIG. 10.

FIGS. 10 and 11 show an alternative seal 100. This alternative seal includes a rail 101 and a wall 104 projecting downwardly from the rail 101. When in place. the rail 101 sits on the top of the continuous upright wall 69 and the wall 104 of the seal 100 is located on the inside of the continuous upright wall 69. The seal has four rib alignment slots 105, each of which is designed to be aligned with the rib receiving orifices 82 and 88 on the base as well as ribs 90, 91, 92 and 93 on the cover. Finally, the seal 100 has four tabs 102, one tab at each corner.

The foregoing description is presented to comply with the disclosure requirements of the patent statutes and is not intended to be limiting. It should be understood that the following claims define the metes and bounds of the invention, that the claims are entitled to a full range of equivalents, and that the terms "disk" and "disks" are to be given their broadest possible meaning so as to include, but not be limited to, both semiconductor wafers and memory disks.

What is claimed is:

1. A package for storing and shipping disks comprising a bottom, a cover and a cassette;

said bottom including a base, a continuous upright side wall extending up from the base and terminating in an inverted U-shaped channel, and a plurality of first locking members associated with said inverted U-shaped channel;

said cover having a top, a continuous wall and a plurality of second locking members, each second locking member for mating with said first locking members to secure the cover to the base, at least one of said first and second locking members having an opening therethrough to provide a flow path for drainage of the inverted U-shaped channel;

said cover further includes a plurality of ribs and said base further includes a plurality of rib receiving orifices aligned so that when the package is closed, a portion of each of said ribs is received within one of said rib receiving orifices.

2. The package of claim 1 wherein said cover includes a plurality of fingers, each of which engages the edge of a disk as the cover is closed and shaped so that as the finger is compressed it assumes a position generally parallel to the edge of the disk so that force is transferred, increasing the finger's resistance to deflection and to minimize movement of the disk.

3. The package of claim 1 further including a wafer cushion mounted to the cover, said cover including a plurality of radial snaps, said wafer cushion including an exterior frame, a plurality of orifices through the frame which receive the radial snaps to secure the wafer cushion to the cover, and a plurality of fingers.

4. The package of claim 3 wherein each of said fingers engages the edge of a disk when the cover is closed and shaped so that as the finger is compressed against the disk it assumes a position generally parallel to the edge of the disk so that force is transferred, increasing the finger's resistance to deflection and minimizing movement of the disk.

5. The package of claim 1 wherein said cassette has two rows of aligned teeth, the teeth in each row being separated by disk-receiving slots, each tooth having a radial contact area along the foot area of each of said teeth to provide contact between a disk and the teeth along a line to minimize stress.

6. The package of claim 1 wherein said bottom includes a second channel and said cover includes a lip.

7. The package of claim 6 further including a seal received by said second channel, said seal being engageable by said lip on said cover when the package is closed.

8. The package of claim 7 wherein said seal includes a tab.

9. The package of claim 8 wherein said second channel, said seal and said lip cooperate to relieve pressure when the pressure differential between the inside and the outside of the package exceeds a predetermined value to prevent mechanical expansion or contraction of the package.

10. The package of claim 1 wherein the continuous wall of the cover has two pair of opposite side walls, each side wall of one of said pair including a pair of said second locking members, the center of each of said second locking members being closer to an end of the side wall than the center of the side wall.

11. A package for storing and shipping disks comprising a bottom, a cover and a cassette;

said bottom including a base, a continuous upright side wall extending up from the base and terminating in an inverted U-shaped channel, and a plurality of first locking members associated with said inverted U-shaped channel, each of said first locking members having a wall projecting outwardly from the U-shaped channel;

said cover having a top, a continuous side wall and a plurality of second locking members, each second locking member from comprising an orifice sized to receive the wall of the first locking member and for mating with said first locking member to secure the cover to the base, at least one of said first and second locking members having an opening therethrough to provide a flow path for drainage of the inverted U-shaped channel.

* * * * *